United States Patent [19]
Ko

[11] Patent Number: 5,710,428
[45] Date of Patent: Jan. 20, 1998

[54] INFRARED FOCAL PLANE ARRAY DETECTING APPARATUS HAVING LIGHT EMITTING DEVICES AND INFRARED CAMERA ADOPTING THE SAME

[75] Inventor: Jin-sin Ko, Suwon, Rep. of Korea

[73] Assignee: SamSung Electronics Co., Ltd., Suwon, Rep. of Korea

[21] Appl. No.: 649,446

[22] Filed: May 17, 1996

[30] Foreign Application Priority Data

Aug. 10, 1995 [KR] Rep. of Korea ............ 95-24701

[51] Int. Cl.$^6$ .................................................. H01L 31/14
[52] U.S. Cl. ........................................ 250/332; 250/338.1
[58] Field of Search ............................... 250/332, 334, 250/338.1, 339.02, 330, 349

[56] References Cited

U.S. PATENT DOCUMENTS

| | | |
|---|---|---|
| 4,620,231 | 10/1986 | Kosonocky . |
| 4,902,894 | 2/1990 | Butler et al. ............ 250/332 |
| 4,914,296 | 4/1990 | Reinhold et al. . |
| 4,977,323 | 12/1990 | Jehle . |
| 4,980,565 | 12/1990 | Jehle . |
| 4,982,092 | 1/1991 | Jehle . |
| 5,093,563 | 3/1992 | Small et al. . |
| 5,332,899 | 7/1994 | Wolney et al. . |
| 5,369,276 | 11/1994 | Antesberger . |

*Primary Examiner*—David P. Porta
*Assistant Examiner*—Richard Hanig
*Attorney, Agent, or Firm*—Robert E. Bushnell, Esq.

[57] ABSTRACT

An infrared detecting, light emitting focal plane array is disclosed. This focal plane array detects infrared image signals, converts the image signals into electrical signals, amplifies the electrical signals, then produces an infrared image by converting the electrical signals back into infrared radiation using light emitting devices. The infrared image produced may be of a different wavelength than the original image signal. The detectors and the emitters are comprised of numerous pixels spread out in a two dimensional planar array. Each pixel is processed independently from the other pixels, as the signals are processed in parallel to each other. The intensity of the emitted light of each pixel varies with the intensity of the incident light for each corresponding pixel. An infrared imaging apparatus is disclosed that uses the infrared image output from the light emitting focal plane array detecting unit to clearly record, photograph, and display real-time infrared images. A charge coupled device photographing device receives the infrared image from the light emitting focal plane array optimized by an optical system, and produces image signals which are then processed in parallel by an image signal processor, allowing for a real-time display of the image. The light emitting focal plane arrays used in the imaging apparatus are modularized so that they can easily be interchanged with another light emitting focal plane array. By selecting the proper module sensitive to the proper wavelengths, the wavelength sensitivity band of the charge coupled device photographing unit can be extended.

20 Claims, 4 Drawing Sheets

34

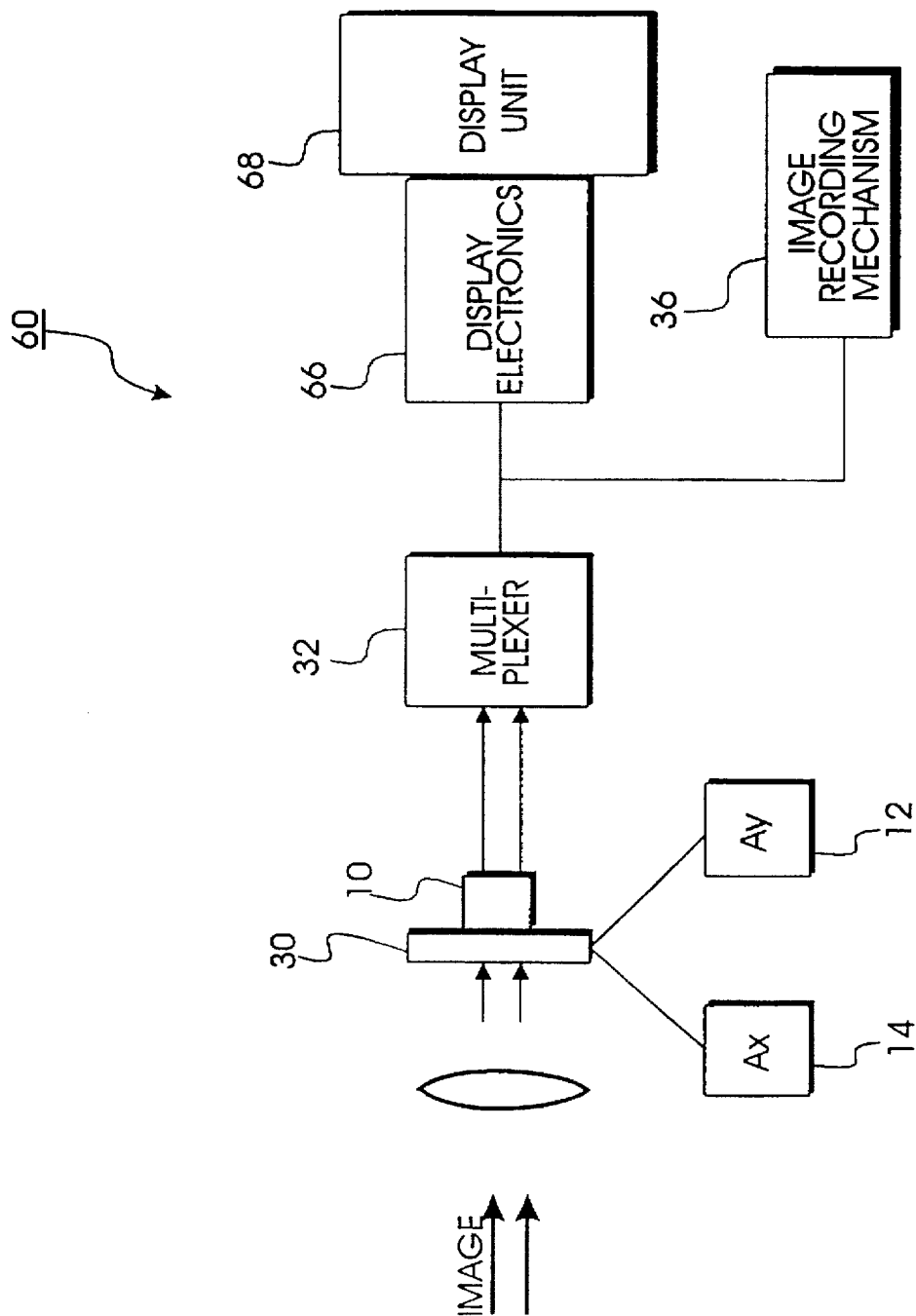

INFRARED FOCAL PLANE ARRAY DETECTING APPARATUS HAVING LIGHT EMITTING DEVICES AND INFRARED CAMERA ADOPTING THE SAME

CROSS-REFERENCE TO RELATED APPLICATIONS

This application makes reference to, incorporates the same herein, and claims all benefits accruing under 35 U.S.C. 517 119 arising from an application for Infrared Focal Plane Array Detecting Apparatus Having Light Emitting Devices and Infrared Camera Adopting the Same earlier filed in the Korean Industrial Property Office on 10 Aug. 1995 and there duly assigned Ser. No. 24701/1995.

FIELD OF THE INVENTION

The present invention concerns the detection, display, photographing, and recording of infrared images.

BACKGROUND OF THE INVENTION

Conventional methods of detecting and imaging infrared radiation begin by converting the image into a plurality of electrical signals, combining the signals into a single transmission line by multiplexing, and then displaying the signal by reconstructing the image from the multiplexer signal. The drawback of this approach is that the multiplexing distorts the signal as well as causes a time delay between detection and display. The present invention seeks to overcome these drawbacks by processing the individual signals in parallel instead of combining them into a single transmission line. This will result in a clear and distinct real-time display of the image.

The use of parallel processing of signals in the detection and display of infrared images is illustrated in art, such as, for example, U.S. Pat. No. 4,982,092 for a 360 Degree Optical Surveillance System, U.S. Pat. No. 4,980,565 for an Electro-Optical Target Acquisition System, and U.S. Pat. No. 4,977,323 for a 360 Degree Infrared Surveillance with Panoramic Display, all to Jehle, describe a real-time infrared detection and display scheme that does not rely upon multiplexing. In Jehle, the infrared image is detected and converted into electrical signals by an array of infrared detectors, the electrical signals are amplified individually, in parallel, and then converted into visible radiation by an array of visible light emitting devices. At no point are the signals mixed or combined otherwise. Jehle does not attempt to photograph or record the infrared image. Instead, Jehle uses the above image reproducing scheme to rotate and derotate the image, amplify the image, and convert the image into a visible wavelength.

In a more recent effort, U.S. Pat. No. 5,369,276 for a Method and System for Real-Time Wavelength Identification for Infrared Detectors to Antesberger discloses a detection device that purports to ascertain the wavelength of incident infrared radiation within the eight to twelve micrometer band, and reproduces the image in visible light. First, the infrared radiation is detected and the image is converted into electrical signals, the electrical signals are amplified, and into a visible image using visible light emitting diode emitters.

U.S. Pat. No. 5,332,899 for a System for Converting an Infrared Image into a Visible or Near Infrared Image to Wolny contemplates a reproduced image in the near infrared with a wavelength smaller than one µm.

U.S. Pat. No. 4,620,231 for a CCD Imager with Photodetector Bias Introduced via the CCD Register to Kosonocky shows a semiconductor structure for the detection of infrared radiation, coupled with charge transfer device. Kosonocky uses a platinum silicide Schottky barrier diode structure to detect the infrared radiation and to convert the radiation into a current, and a buried charge coupled device (BCCD) to transport the charge to an external electronic device.

Despite these many efforts in the art, I have discovered that the prior art has been unable to provide a reproduced image with a wavelength greater than one µm allowing for the reproduced real-time image to be photographed, recorded, and displayed using an infrared sensitive charge coupled device photographing device.

SUMMARY OF THE INVENTION

It is therefore an object of the present invention to provide an improved infrared focal plane array and process.

It is another object to provide an infrared focal plane array detecting apparatus and process able to simultaneously reproduce infrared images borne by infrared radiation without diminution in the clarity or quality of the reproduced images.

It is yet another object to provide an infrared focal plane array generating on infrared images in a plane array amenable to subsequent optical magnification and focusing.

It is still another object to provide a clear and distinct, real-time infrared image display, photographing and recording apparatus by coupling the infrared image output from the light emitting focal plane array infrared detector to an infrared sensitive charge coupled device photographing device.

It is still yet another object to provide an infrared image photographing, display, and recording apparatus that contains a modular light emitting focal plane array infrared detector able to detect or emit infrared radiation of one wavelength, that can be easily interchanged with another light emitting focal plane array infrared detector that emits or detects infrared radiation of a different wavelength, thereby allowing a photographing unit to photograph infrared images having wavelengths outside the sensitivity range of the photographing unit.

It is a further object to provide for an automated feedback control loop, where the image signal processor for the charge coupled device photographing device is used to calculate a real-time correction factor for both an optical system that focuses and magnifies the infrared image emanating from the focal plane array and for an array of electronic amplifiers used to control the intensity of the infrared images emitted by the light emitting devices of the focal plane array.

It is yet another object to allow a user to override the automated feedback control loops so that the user can manually input correction factors for both the optical system used to focus and magnify the infrared image incident on the charge coupled device photographing device and for the electronic amplifiers used to control the intensity of the infrared image incident on the charge coupled device photographing device.

These and other objects may be achieved by first building a light emitting focal plane array where the image signals are first converted to electrical signals by detectors, the resultant electrical signals are then amplified, and the amplified electrical signals are converted back into an infrared image based on the image signals. This is accomplished by having each detector of the infrared detector array coupled to a unique and separate light emitting device so that each light emitting device can be uniquely identified with a unique and separate detector. Each light emitting device emits infrared radiation at an intensity that corresponds to the intensity of infrared radiation incident upon the corresponding detector device. This arrangement for converting image signals into electrical signals, and then converting the electrical signals into infrared image based on the image signals allows the infrared image output from the focal plane array to be of a different wavelength than the image signals incident to the focal plane array. This feature, along with the fact that the array is modular, enables a photographing unit, sensitive to only a narrow band of wavelengths, to photograph image signals that lie outside this narrow band of sensitivity.

In addition to recording, photographing and displaying the image, the image signal processor also automatically provides a feedback control signal to correct the optical system and the electronic amplifiers in order to optimize the image quality of the infrared image. This automatic feedback control signal may be overridden by a manual input from a user at a keypad. Thus, a user may observe the real-time image on the display unit, decide on his own correction factor for the optical system and the electronic amplifier, and enter the correction factor into a keypad to improve the display.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein:

FIG. 2 is a diagram of a simplified representation of a conventional infrared imaging apparatus;

DETAILED DESCRIPTION OF THE INVENTION

Figure 1:
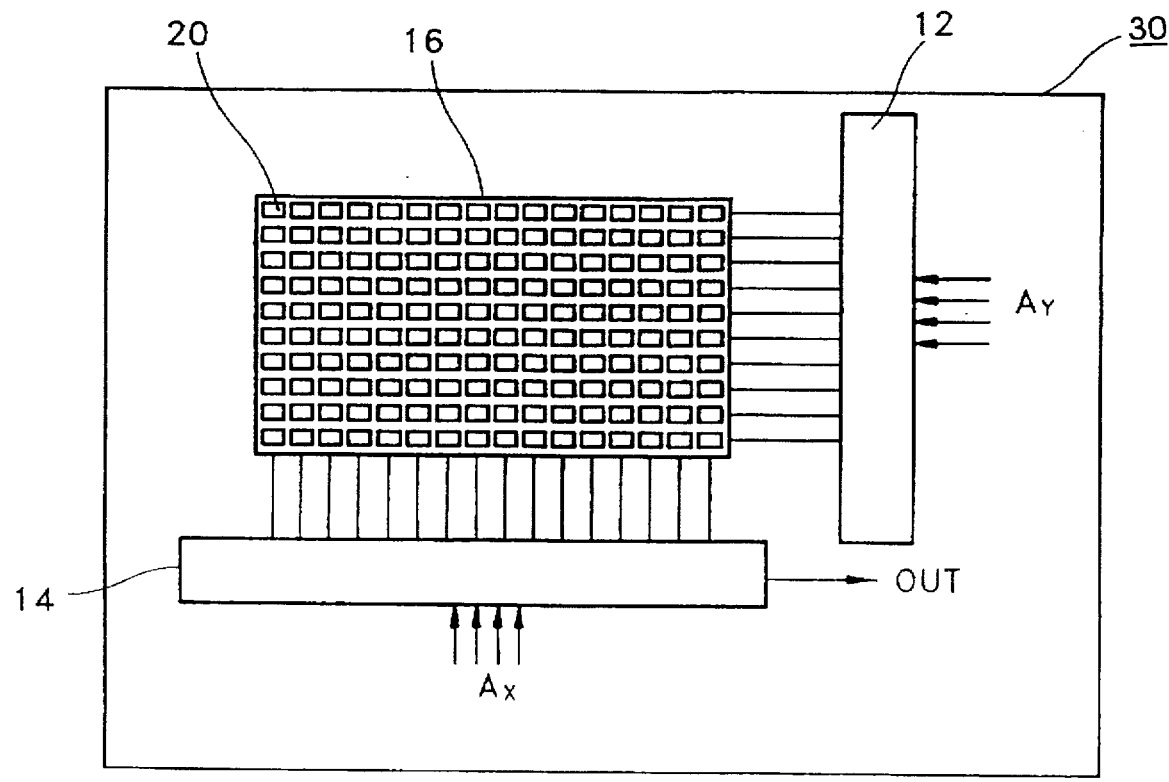
FIG. 1 is a plan view of an abstract representation of a conventional infrared focal plane array detecting apparatus.

Now turning to the drawings, FIG. 1 is a plan view of a conventional infrared focal plane array detecting apparatus 30. The infrared focal plane array detecting apparatus may be constructed with a horizontal address buffer 12 for receiving a horizontal address $A_y$, vertical address buffer 14 for receiving a vertical address $A_x$ and infrared detecting device 16 is connected to horizontal and vertical address buffers 12 and 14, and a plurality of infrared detectors 20 are arranged in a two-dimensional array therein. In infrared focal plane array detecting apparatus 30, infrared detector 20 is selected from infrared detecting array 16 according to horizontal and vertical addresses $A_y/A_x$ output from horizontal and vertical address buffers 12 and 14 respectively, and the output of the selected infrared detector is controlled by controller 10. Infrared detector 20 detects an infrared signal and then converts the detected signal into an electric signal, and the infrared signal detected by an infrared detector lights a pixel. Here, the brightness of each pixel is determined according to the intensity of the infrared signal detected by infrared detector 20. For example, if '0000' and '0001' are allocated to vertical and horizontal addresses $A_x$ and $A_y$, respectively, infrared detector 20 is selected from infrared detecting array 16, so that voltage or current output from infrared detector 20 is output to an image signal processor (not shown) via an output end OUT. The electric signal converted by infrared detector 20 is read by a multiplexer or other serial output device, in sequence, so that it takes a substantially long time to process the image signal.

A conventional infrared imaging apparatus 60 abstractly represented in FIG. 2, receives the electric signal output from the conventional infrared focal plane array detection apparatus 30 in sequence, and then converts the electric signal into an image signal. When conventional infrared focal plane array detecting apparatus 30 is used inside a conventional imaging apparatus 60 formed by a driver stage such as display electronics 66 and a variable visual display such as a display unit 68 (e.g., a cathode ray tube), the electric signal output from infrared focal plane array array detecting apparatus 30 is read by multiplexer 32 or other serial output device in sequence causing the image reproduced in image recording mechanism 36 not to be distinct nor a real-time display.

Figure 3:
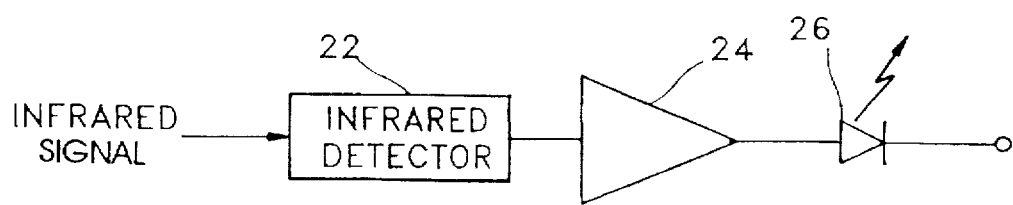
FIG. 3 is a circuit diagram showing the structure of a single pixel of the infrared focal plane array detecting apparatus used in the practice of the present invention.

FIG. 3 is a circuit diagram showing a single pixel structure 34 from a light emitting focal plane array infrared detector according to the present invention. Unlike the conventional pixels, the light emitting focal plane array pixel 34 shown in FIG. 3 may be constructed with an infrared detector 22 positioned to detect an infrared signal and convert the detected signal into an electrical signal, an electronic amplifier 24 for amplifying the electrical signal output from infrared detector 22 to a predetermined level, and a light emitting device 26 for emitting light in accordance with output signal of amplifier 24. The intensity of light emitted by light emitting device 26 is varied according to the intensity of the infrared signal detected by infrared detector 22. Light emitting device 26 can be a light emitting diode (LED), a liquid crystal display (LCD), an electroluminescence display (EL), or some other electromagnetic radiation producing device.

Figure 5:
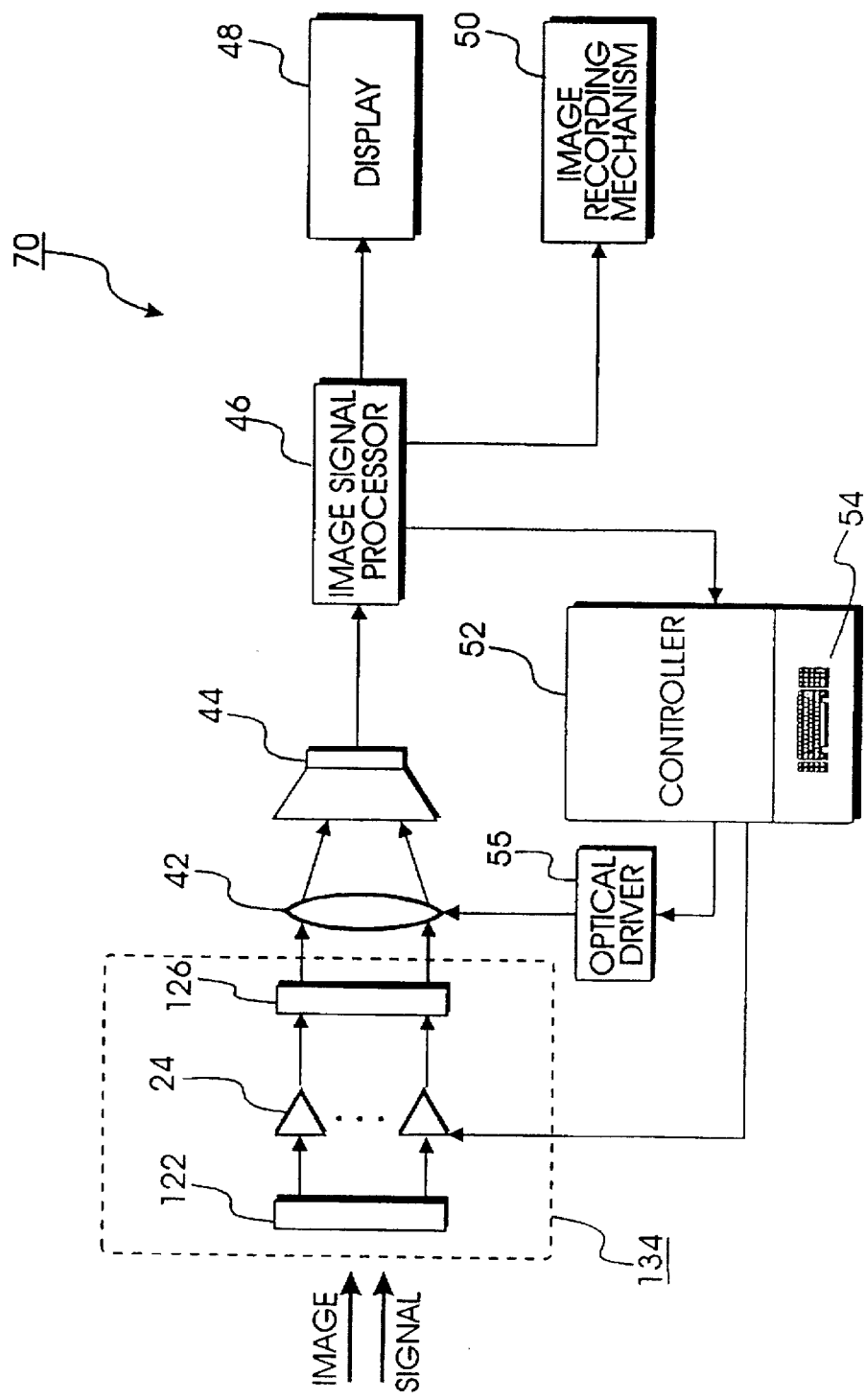
FIG. 5 is a diagram of an infrared imaging apparatus of the present invention with a charge coupled device photographing device incorporating the light emitting focal plane array infrared detector of FIG. 3.

Referring now additionally to FIG. 5, light emitting focal plane array 134 in FIG. 5 is made up of a plurality of light emitting focal plane array pixels 34 of the type shown in FIG. 3, all arranged in the two dimensional planar array 134. The intensity of light output from each emitter 26 in a plane an array 126 is dependent upon the intensity of infrared radiation incident upon the corresponding detector device 22 in the detector array 122 and on the gain of the corresponding electronic amplifier 24 connected to the emitter. Thus, if all the electronic amplifiers 24 in the focal plane array 134 have the same gain, the emitted infrared image will be a clear and distinct real-time reproduction of the incident image signal. The emitted image may be intensified by increasing the gain on all the electronic amplifiers.

Figure 4:
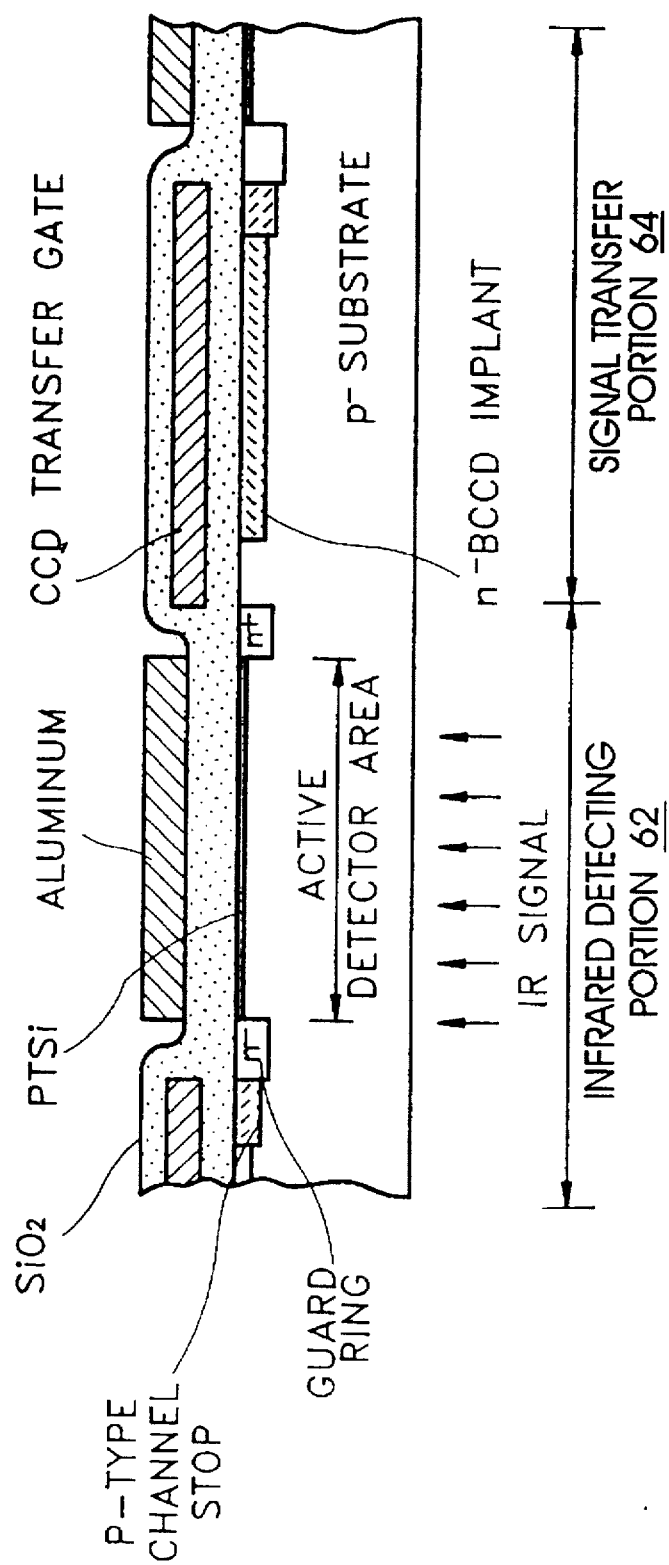
FIG. 4 is a cross section of a detector element and the adjacent charge coupled gate transfer device, each fabricated on silicon.

FIG. 4 is a diagram showing internal fabricated semiconductor structure 72 of infrared detector 22 of FIG. 3. Structure shown in FIG. 4 is analogous to the structure found in *Infrared Technology Fundamentals*, 2nd ed., by Monroe Schlessinger (1995), FIG. 11, at page 152. As shown in FIG. 4, infrared detector 22 may be constructed as a pair of solid state electronic devices fabricated next to each other on a silicon wafer substrate. The semiconductor structure 72 of infrared detector 22 is divided into infrared detecting portion 62 for detecting an impingent infrared signal and converting the detected signal into an electrical signal, and signal transfer portion 64 having a charge coupled device (CCD) transfer gate for storing and transferring the electrical signal to electronic amplifier 24. After an infrared signal is detected in infrared detecting portion 62, the detected infrared signal is converted into an electrical signal in infrared detecting portion 62, and the electrical signal is transferred to amplifier 24 (shown in FIG. 3) by charge coupled device transfer gate 64. The electrical signal is amplified to a predetermined level by amplifier 24, and then transferred to light emitting device 26.

FIG. 5 is a diagram of the infrared imaging apparatus 70 as it might be constructed according to the principles of the present invention. Imaging apparatus 70 incorporates the light emitting focal plane array infrared detector 34 shown in FIG. 3. In addition to light emitting focal plane array infrared detector 34, imaging apparatus 70 contains optical system 42 to focus and either magnify or reduce the size of the infrared image produced by light emitting focal plane array 134. Charge coupled device photographing device 44 photographs the reproduced image focused by optical system 42. Image signal processor 46 receives the image signal, output in parallel, from charge coupled device photographing device 44, and parallely processes the image for display unit 48 and recording mechanism 50 using animate interpolation and enhancement method for increasing resolution of the image signal. Image signal processor 46 also determines what corrections are needed for optical controller 52 for focus and magnification, and for electronic amplifiers 24 to intensify their amplification of the image in order to optimize the infrared image incident on charge coupled device photographing device 44. Image signal processor 46 then adjusts the degree of amplification provided by electronic amplifiers 24 and adjusts the focusing provided by optical system 42 so that an improved infrared image can be sensed by charge coupled device photographing device 44. Keypad 54 allows a user to manually override the image signal processor 46 in determining correction factors to be applied to electronic amplifiers 24 and optical system 42. Image signal processor 46 processes the infrared image signals in parallel so that the infrared image can be recorded and displayed.

The charge coupled device photographing device 44 by itself may be sensitive to only a narrow band of wavelengths of infrared radiation. By using a modular light emitting focal plane array, the charge coupled device photographing device 44 can photograph image signals composed of electromagnetic radiation of wavelengths outside this narrow band because the light emitting focal plane array can emit a wavelength different from the wavelength detected. The modularity feature of the foregoing embodiment allows a new array unit capable of detecting different wavelengths to be easily be installed to replace the old array unit if the wavelength of the incident image signal changes. By using an appropriate detector array, the present invention may be adopted to detect radiation in the visible and ultraviolet range, if so desired.

Because apparatus 70 processes the signals in parallel, the image displayed by display unit 48 is a real-time replica of the incident image signal. Light emitting focal plane array 134, as well as image signal processor 46, process the infrared image and the image signal respectively in parallel. There is no requirement for either multiplexing or serial output devices in apparatus 70. The result is an image which is a current, real-time snapshot of the image signal.

The above embodiment can be used in infrared cameras as well as camcorders. The modular array unit allows for the photographing of a wide range of wavelengths and the parallel image signal processor allows for a real-time, distinct image.

What is claimed is:

1. A real-time wavelength infrared detection system, comprising:
   a plurality of detectors arranged to convert an impingent first image signal into a plurality of parallel electrical signals;
   a plurality of electronic amplifiers, each separately connected to correspondingly different ones of said plurality of detectors, to amplify said plurality of electrical signals;
   a plurality of emitters of electromagnetic radiation, each connected to correspondingly different ones of said plurality of electronic amplifiers, to convert said plurality of electrical signals into an infrared image having a wavelength that is greater than 1 µm, said infrared image being based upon said first image signal;
   optics means for focusing and magnifying said infrared image;
   charge coupled device photographing device means positioned to photograph said infrared image, generating a second image signal representative of said infrared image;
   image signal processing means for processing in parallel said image signal produced by said charge coupled device photographing device means, using an image interpolation and enhancement method; and
   display means for displaying said image signals processed by said image signal processing means.

2. The system in claim 1, further comprising a plurality of charge coupled transfer gate devices for transferring each of said plurality of electrical signals from each of said plurality of infrared detectors to correspondingly different ones of said plurality of electronic amplifiers.

3. The system of claim 2, where said plurality of detectors, said plurality of charge coupled transfer gate devices, said plurality of emitters, and said plurality of electronic amplifiers form a single integrated monolithic unit.

4. The system of claim 3 where said single integrated monolithic unit is modular and interchangeable with a second integrated monolithic unit responsive to a band of electromagnetic radiation different than said single integrated monolithic unit.

5. The system of claim 1, comprised of means for automatically controlling focusing and amplification where said optics means and said electronic amplifiers are controlled automatically by signals from said image signal processing means.

6. The system of claim 1, comprised of means for enabling manual control of said optics means and said electronic amplifiers from a keypad.

7. The device of claim 1, where said first image signal is comprised of infrared electromagnetic radiation.

8. The device of claim 7, where said plurality of detectors are capable of detecting said first image signal.

9. A method of detecting and displaying a first image signal, comprising:
   detecting said first image signal by converting said first image signal into a plurality of electrical signals;
   transferring said plurality of electrical signals from a detector to an electronic amplifier;
   amplifying said plurality of electrical signals in to a plurality of amplified electrical signals;

reproducing said first image signal by converting said plurality of electrical signals into a reproduced first image signal having a wavelength greater than 1 micron;

focusing and magnifying said reproduced first image signal;

photographing said reproduced first image signal using a charge coupled device photographing device that converts said reproduced first image signal into a second image signal;

processing said second image signal with an image signal processor, using an image interpolation and enhancement method; and displaying the image signal output of said image signal processor.

10. The method of claim 9, where said plurality of electrical signals are processed in parallel and simultaneous with respect to each other.

11. The method of claim 9, where said second image signals is processed in parallel by said image signal processor.

12. The method of claim 9, further comprising of automatically adjusting, based on feedback signals from said image signal processor:

said focus and magnification of said reproduced first image signal; and said amplification of said plurality of electrical signals.

13. The method of claim 9, further comprising of adjusting, via manual inputs from a keypad:

said focus and magnification of said reproduced first image signal; and said amplification of said electrical signals.

14. The device of claim 9, where said charge couple device photographic device is sensitive to electromagnetic radiation having a wavelength greater than one micron.

15. The device of claim 14, where said detector is capable of detecting said first image signal.

16. An infrared emitting focal plane array, comprising:

a plurality of detectors positioned in a planar array to convert an image signal into a plurality of electrical signals;

a plurality of charge coupled gate transfer devices to deliver said plurality of electrical signals from said planar array to a plurality of electronic amplifiers;

said plurality of electronic amplifiers to amplify said plurality of electrical signals and produce a plurality of amplified electrical signals; and a plurality of emitters that convert said plurality of amplified electrical signals into an infrared image having a wavelength greater than 1 micron based on said image signal, where each of said plurality of detectors is coupled to correspondingly different ones of said plurality of charge coupled gate transfer devices which, in turn, is coupled to correspondingly different ones of said plurality of electronic amplifiers which, in turn, is connected to correspondingly different ones of said plurality of emitters.

17. The infrared emitting focal plane array of claim 16, where the intensity of said infrared image corresponds with the intensity of said image signal.

18. The infrared emitting focal plane array of claim 16, where said focal plane array is modular.

19. The device of claim 1, where said image signal is comprised of infrared electromagnetic radiation.

20. The device of claim 19, where said plurality of detectors are capable of detecting said image signal.

* * * * *